United States Patent
Teo et al.

(10) Patent No.: US 7,190,936 B1
(45) Date of Patent: Mar. 13, 2007

(54) VOLTAGE REGULATOR FOR HIGH PERFORMANCE RF SYSTEMS

(75) Inventors: Swee-Ann Teo, Sunnyvale, CA (US); Lawrence Tse, Fremont, CA (US); Yonghua Song, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 442 days.

(21) Appl. No.: 10/747,522

(22) Filed: Dec. 29, 2003

Related U.S. Application Data

(60) Provisional application No. 60/470,620, filed on May 15, 2003.

(51) Int. Cl.
*H04B 1/04* (2006.01)
*H04B 1/06* (2006.01)

(52) U.S. Cl. ............................. 455/127.1; 455/127.2; 455/241.1

(58) Field of Classification Search ............ 455/127.1, 455/127.2, 343.1, 572, 91, 126, 127.3, 253.2, 455/241.1; 323/280, 281, 273; 330/278
See application file for complete search history.

(56) References Cited

U.S. PATENT DOCUMENTS

| | | | |
|---|---|---|---|
| 4,766,364 A | 8/1988 | Biamonte et al. | |
| 5,175,488 A | 12/1992 | Moroney | |
| 6,130,526 A | 10/2000 | Yang et al. | |
| 6,246,221 B1 * | 6/2001 | Xi | 323/280 |
| 6,529,563 B1 | 3/2003 | Mosinskis et al. | |
| 6,765,374 B1 * | 7/2004 | Yang et al. | 323/280 |
| 6,806,690 B2 * | 10/2004 | Xi | 323/273 |
| 7,030,595 B2 * | 4/2006 | Akita | 323/280 |
| 2005/0057234 A1 * | 3/2005 | Yang et al. | 323/273 |
| 2005/0190475 A1 * | 9/2005 | Poss | 360/46 |
| 2005/0208909 A1 * | 9/2005 | Maya et al. | 455/271.1 |

FOREIGN PATENT DOCUMENTS

EP 0942531 A2 9/1999

OTHER PUBLICATIONS

ANSI/IEEE Std. 802.11, 1999 Edition; Part 11: Wireless LAN Medium Access Cntrol (MAC) and Physical Layer (PHY) Specifications; Information technology—Telecommunications and information exchange between systems—Local and metropolitan area networks—Specific requirements; pp. 1-512.

(Continued)

*Primary Examiner*—Sonny Trinh

(57) ABSTRACT

A voltage regulator includes a master regulator circuit that receives a reference signal, that generates a master bias signal and that includes a transistor having a first gain. A first slave regulator circuit includes a first transistor having a second gain that is substantially equal to unity gain, a control terminal that receives the master bias signal from the master regulator circuit, a first terminal and a second terminal that outputs a first regulated output signal. A second slave regulator circuit includes a second transistor having a second gain that is substantially equal to unity gain, a control terminal that receives the master bias signal from the master regulator circuit, a first terminal, and a second terminal that outputs a second regulated output signal.

60 Claims, 4 Drawing Sheets

OTHER PUBLICATIONS

IEEE P802.11g/D8.2 Apr. 2003 (Supplement to ANSI/IEEE std. 802.11 1999(Reaff 2003)) Draft Supplement Standard for Part 11: Wireless LAN Medium Access Cntrol (MAC) and Physical Layer (PHY) Specifications; Information technology—Telecommunications and information exchange between systems—Local and metropolitan area networks—Specific requirements; Further Higher Data Rate Extension in the 2.4 GHz Band; pp. 1-69.

IEEE Std. 802.11a-1999; Supplement to IEEE Standard for Information Technology—Telecommunications and information exchange between systems—Local and metropolitan area networks—Specific requirements; Part: 11 Wireless LAN Medium Access Control (MAC) and Physical Layer (PHY) specifications; High-speed Physical Layer in the 5 GHz Band; pp. 1-83.

IEEE Std. 802.11b; Supplement to IEEE Standard for Information technology—Telecommunications and information exchange between systems—Local and metropolitan area networks—Specific requirements; Part 11: Wireless LAN Medium Access Control (MAC) and Physcial Layer (PHY) specifications: Higher-Speed Physical Layer Extension in the 2.4 GHz Band; Approved Sep. 16, 1999; pp. 1-89.

IEEE Std. 802.11b-1999/Cor 1-2001;IEEE Standard for Information technology—Telecommunications and information exchange between systems—Local and metropolitan area networks—Specific requirements; Part 11: Wireless LAN Medium Access Cntrol (MAC) and Physical Layer (PHY) Specifications; Amendment 2: Higher-speed Physical Layer (PHY) extension in the 2.4 GHz band—Corrigendum 1; pp. 1-15.

IEEE Std. 802.16; IEEE Standard for Local and metropolitan area networks; Part 16: Air Interface for Fixed Broadband Wireless Access Systems; Apr. 8, 2002; pp. 1-322.

IEEE Std. 802.16a; IEEE Standard for Local and metropolitan area networks; Part 16: Air Interface for Fixed Broadband Wireless Access Systems—Amendment 2: Medium Access Control Modifications and Additional Physical Layer Specifications for 2-11 GHz; Apr. 1, 2003: pp. 1-292.

"802.16 IEEE Standard for Local and Metropolitan Area Networks; Part 16: Air Interface for Fixed Broadband Wireless Access Systems," 802.16 IEEE Standard for Local and Metropolitan Area Networks, Oct. 1, 2004, pp. i-xxxiv and pp. 1-857, IEEE Std 802.16-2004, IEEE, United States.

\* cited by examiner

VOLTAGE REGULATOR FOR HIGH PERFORMANCE RF SYSTEMS

CROSS-REFERENCE TO RELATED APPLICATIONS

This application claims the benefit of U.S. Provisional Application No. 60/470,620, filed on May 15, 2003, which is hereby incorporated by reference in its entirety.

FIELD OF THE INVENTION

The present invention relates to voltage regulators, and more particularly to voltage regulators for high performance radio frequency (RF) systems.

BACKGROUND OF THE INVENTION

Circuits in high performance radio frequency (RF) systems such as but not limited to wireless communications devices often require a regulated supply voltage. Voltage regulators are typically used to regulate the supply voltage. In some RF systems, more than one voltage regulator may be required. In other applications with spatial limitations, multiple circuits may share the same voltage regulator. For example, a voltage-controlled oscillator (VCO) circuit and a mixer circuit may share the same regulated supply. In this configuration, noise from the mixer circuit often appears at the output of the VCO circuit and vice-versa.

Referring now to FIG. 1, an exemplary voltage regulator 10 includes an operational amplifier (opamp) 12 and a PMOS transistor 14. An inverting input of the opamp 12 receives a reference voltage signal 16 and a non-inverting input of the opamp 12 receives a feedback signal 18. The opamp 12 generates an output voltage signal 20 that is based on a difference between the reference voltage signal 16 and the feedback signal 18.

The output voltage signal 20 is input to a gate of the PMOS transistor 14. A source of the PMOS transistor 14 is connected to a supply voltage 22. A drain of the PMOS transistor 14 is connected to the non-inverting input of the opamp 12 to provide the feedback signal 18. The voltage regulator 10 outputs a regulated signal 26 to an RF subcircuit 28 of a RF system 30. When supplying a single RF subcircuit 28, the regulated signal 26 is stable and constant. When a single voltage regulator supplies more than one RF sub-circuit, noise or crosstalk from one of the RF sub-circuits may appear in the output of the other RF sub-circuit.

Referring now to FIG. 2, separate voltage regulators may be used for each subcircuit to eliminate the noise. The RF circuit 30 includes n RF subcircuits 28-1, . . . , 28-n that require voltage regulation. Voltage regulators 10-1, . . . , 10-n are provided for each RF subcircuit 28-1, . . . , 28-n, respectively. The voltage regulators 10-1, . . . , 10-n include opamps 12-1, . . . , 12-n, and transistors 14-1, . . . , 14n, respectively. Feedback signals 18-1, . . . , 18-n are generated as described above. When multiple voltage regulators 10-1, . . . , 10n are used, the spatial requirements and current dissipation of the RF system 30 increase.

SUMMARY OF THE INVENTION

A voltage regulator according to the present invention includes a master regulator circuit that receives a reference signal, that generates a master bias signal and that includes a transistor having a first gain. A first slave regulator circuit includes a first transistor having a second gain that is substantially equal to unity gain, a control terminal that receives the master bias signal from the master regulator circuit, a first terminal and a second terminal that outputs a first regulated output signal. A second slave regulator circuit includes a second transistor having a third gain that is substantially equal to unity gain, a control terminal that receives the master bias signal from the master regulator circuit, a first terminal, and a second terminal that outputs a second regulated output signal.

In other features, the master regulator circuit includes an opamp having a non-inverting input that receives the reference signal, an inverting input and an output. The output of the opamp generates the master bias signal, which is output to a control terminal of the transistor.

In yet other features, the master regulator circuit includes a current source. A second terminal of the transistor communicates with the current source and the inverting input of the opamp. The transistor includes a first terminal. The first terminals of the transistor, the first transistor and the second transistor are biased by a first voltage potential.

In still other features, the transistor, the first transistor and the second transistor are NMOS transistors. The first gain is greater than unity gain.

In still other features, a Radio Frequency (RF) circuit includes the voltage regulator, a first RF subcircuit that receives the first regulated output signal, and a second RF subcircuit that receives the second regulated output signal. The RF circuit is a wireless communications device.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 2:
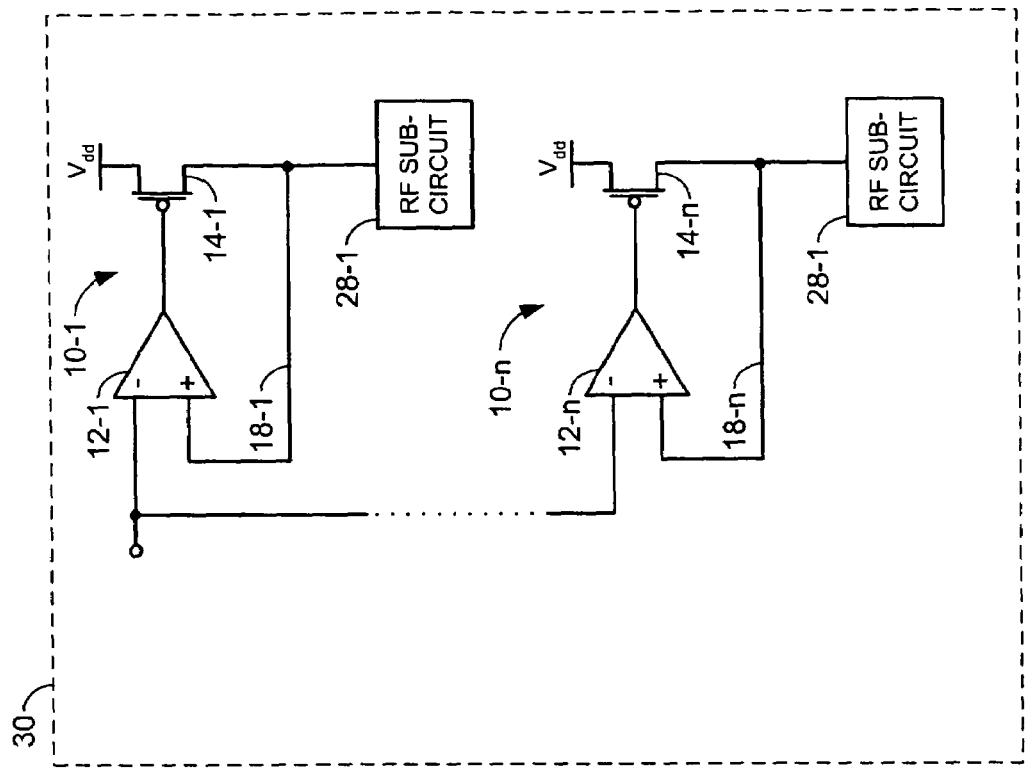
FIG. 2 is a schematic of an RF circuit with multiple RF subcircuits and voltage regulators with feedback circuits according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 3:
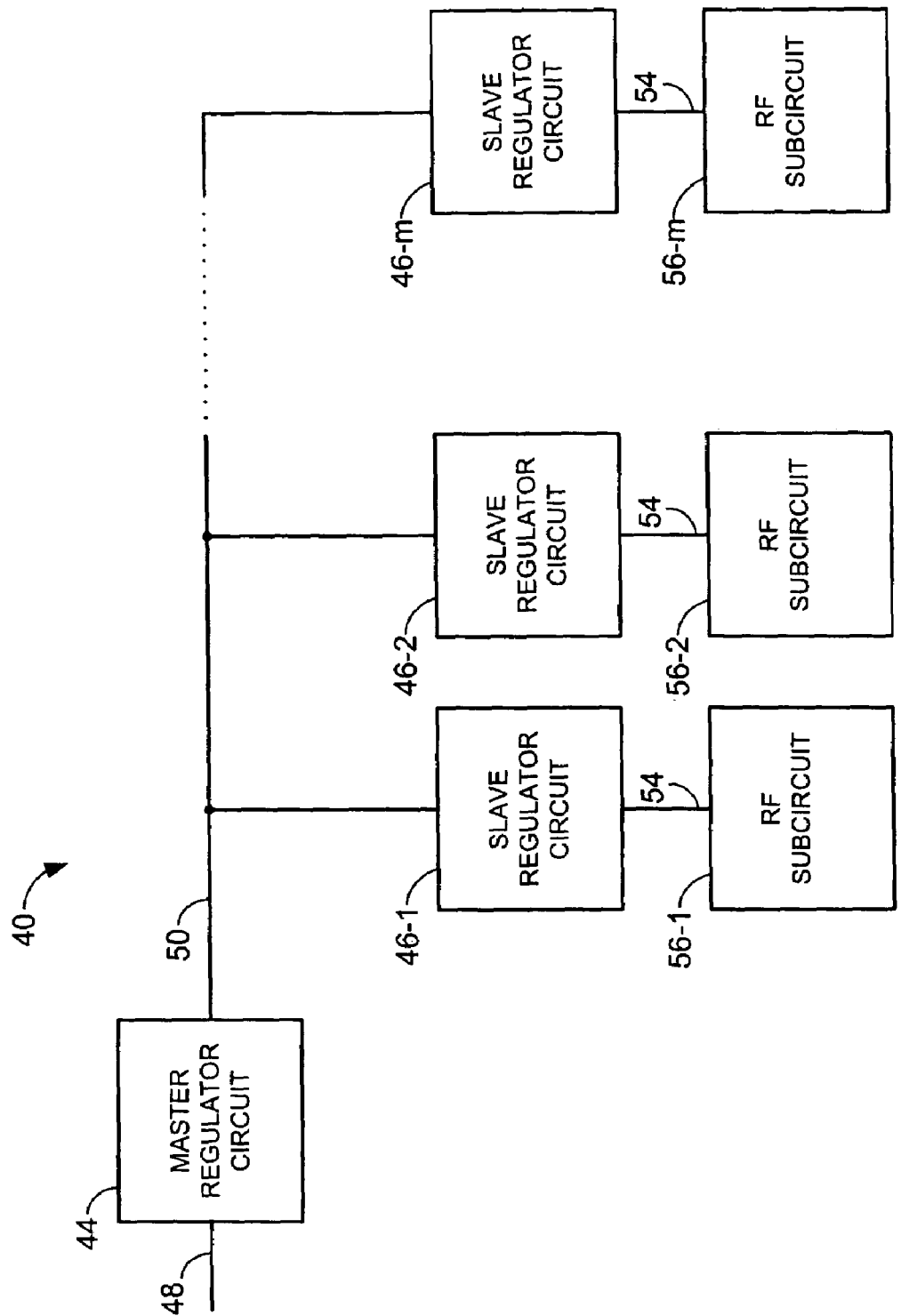
FIG. 3 is a functional block diagram of a voltage regulator with a master and multiple slave regulator circuits according to the present invention.

Referring now to FIG. 3, a voltage regulator 40 includes a master regulator circuit 44 and one or more slave regulator circuits 46-1, 46-2, . . . , and 46-m (collectively identified as slave regulator circuits 46). The master regulator circuit 44 receives a reference voltage signal 48 and generates a master bias signal 50, as will be described below. The slave regulator circuits 46 receive the master bias signal 50 from the master regulator circuit 44. The slave regulator circuits 46 output a regulated signal 54 based on the master bias signal 50. RF subcircuits 56-1, 56-2, . . . , and 56-*m* (collectively identified as RF subcircuits 56) receive the regulated signal 54. Because the desired supply voltage for the RF subcircuit 56 is sensed and adjusted at the master regulator circuit 44, the slave regulator circuits 46 operate as level shifters and unity gain buffers and have feedback. The slave regulator circuits 46 have a second gain that is substantially equal to unity gain. As used herein, the term substantially equally to unity gain means a gain that is greater than 0.5 and less than 2.

Figure 4:
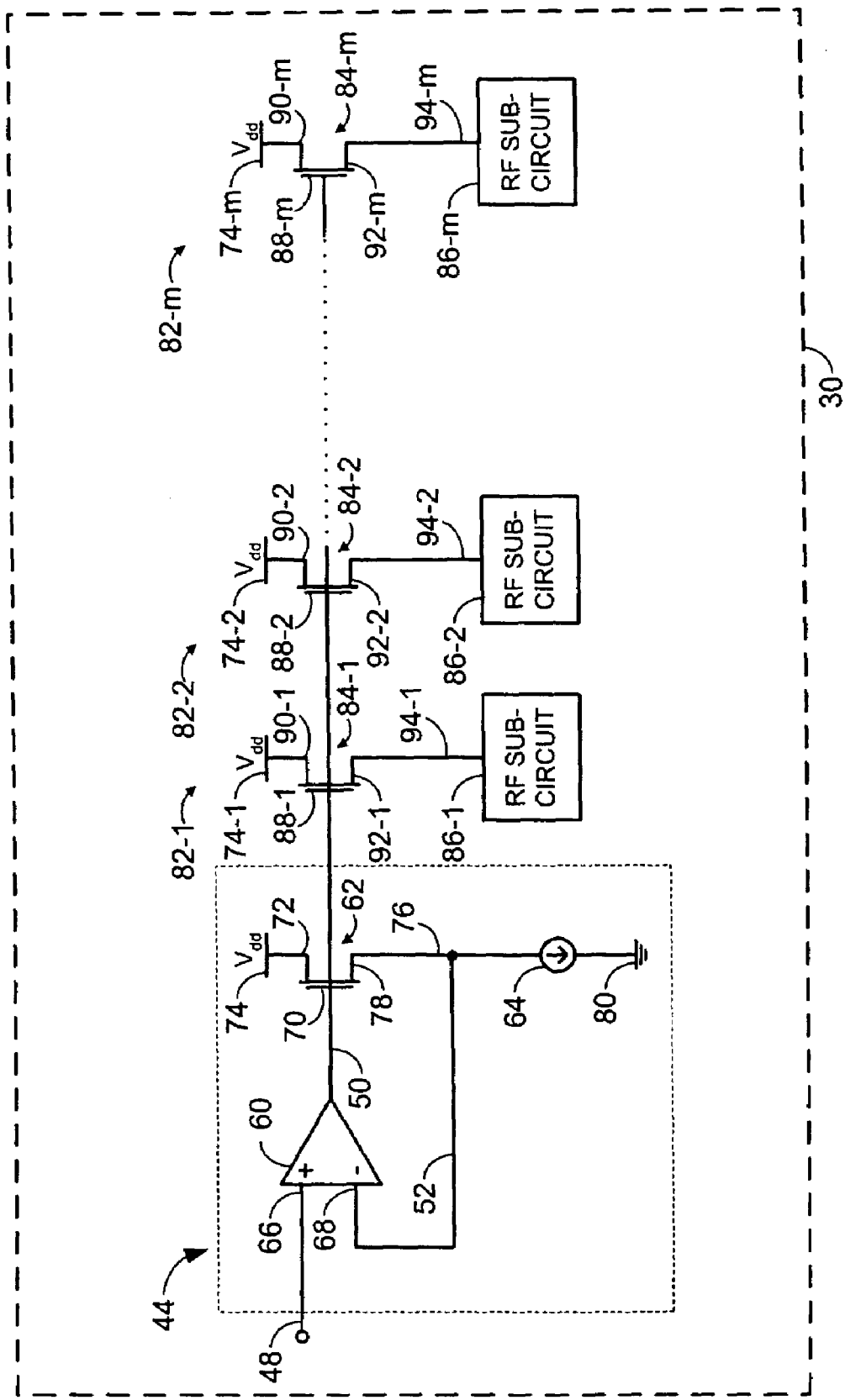
FIG. 4 is an electric schematic of the voltage regulator of FIG. 3.

Referring now to FIG. 4, the master regulator circuit 44 includes an opamp 60, a first NMOS transistor 62, and a current source 64. The reference voltage signal 48 communicates with a non-inverting input 66 of the opamp 60. The opamp 60 outputs the master bias signal 50, which biases a gate terminal 70 of the first NMOS transistor 62. A drain terminal 72 of the first NMOS transistor 62 communicates with a supply voltage 74. A source terminal 78 of the first NMOS transistor 62 communicates with an inverting input 68 of the opamp 60 to provide a feedback signal 52 and with the current source 64, which is referenced to a ground potential 80.

The master bias signal 50 is regulated based on a difference between the reference voltage signal 48 and the feedback signal 52. The master bias signal 50 is output to slave regulator circuits 82-1, 82-2, . . . ,82-*m*. The slave regulator circuits 82-1, 82-2, . . . , 82-*m* include second NMOS transistors 84-1, 84-2, . . . , 84-*m*. The slave regulator circuits 82-1, 82-2, . . . , 82-*m* provide a regulated signal to RF subcircuits 86-1, 86-2, . . . , 86-*m* of the RF system 30. The master bias signal 50 biases gates 88-1, 88-2, . . . , 88-*m* of the second NMOS transistors 84-1, 84-2, . . . , 84-*m*. Drain terminals 90-1, 90-2, . . . , 90-N of the second NMOS transistors 84-1, 84-2, . . . , 84-*m* communicate with a supply voltage 74-1, 74-2, . . . , 74-*m*. Source terminals 92-1, 92-2, . . . , 92-*m* of the second NMOS transistors 84-1, 84-2, . . . , 84-*m* output a regulated supply voltage signal 94-1, 94-2, . . . , 94-*m* to the RF subcircuits 86-1, 86-2, . . . , 86-*m*. In this arrangement, the second NMOS transistors 84-1, 84-2, . . . , 84-*m* act as source followers.

Figure 1:
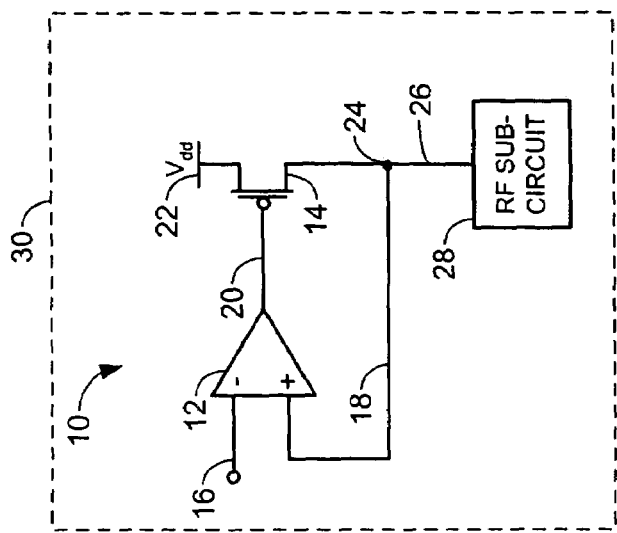
FIG. 1 is a schematic of an exemplary voltage regulator according to the prior art.

The regulated supply voltage 94-1, 94-2, . . . , 94-*m* is based on a difference between the reference voltage signal 48 and the feedback signal 52, which is generated in the master regulator circuit 44. Because the second NMOS transistors 84-1, 84-2, . . . , 84-*m* have substantially unity gain, the slave regulator circuits 82-1, 82-2, . . . , 82-*m* act as unity gain buffers for the master control voltage signal 50. In conventional regulator circuits shown in FIGS. 1 and 2, a small change in the output signal 20 can significantly impact the regulated signal 26 that is input to the circuit blocks 28 because the PMOS transistor 14 does not have unity gain.

Figure 5:
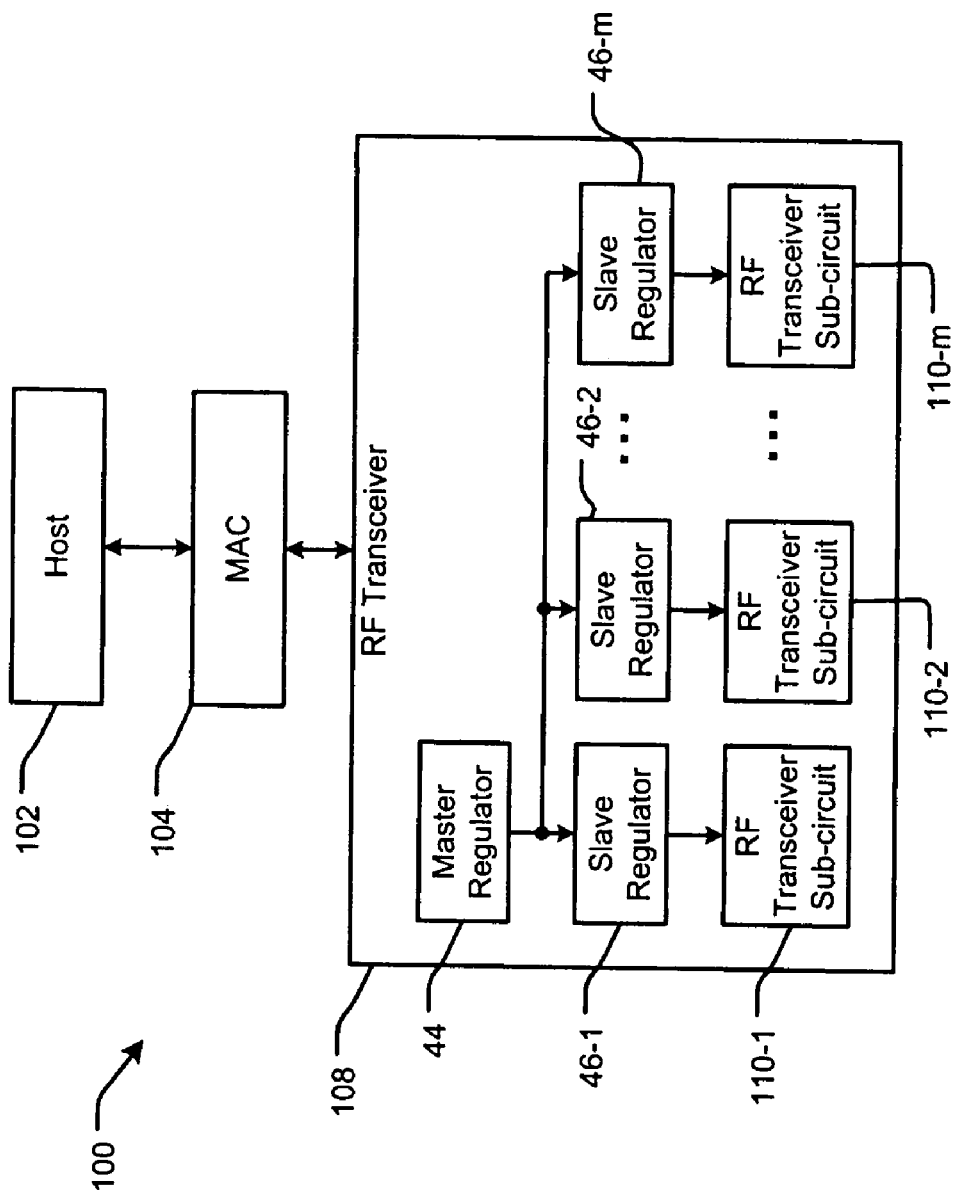
FIG. 5 is a functional block diagram of the voltage regulator of FIG. 3 implemented in an RF transceiver of a wireless communications device.

Referring now to FIG. 5, the master regulator 44 and slave regulators 46-1, 46-2, . . . , 46-*m* can be used in wireless communication devices. In one implementation, a wireless communications device 100 is connected to a host device 102 such as but not limited to a desktop computer, a personal digital assistant (PDA), a laptop computer, a gaming console, an access point and the like. The wireless communications device 100 further includes a medium access control (MAC) device 104 and an RF transceiver 108. The master regulator 44 and slave regulators 46-1, 46-2, . . . , and 46-*m* supply regulated outputs to RF subcircuits 110-1, 110-2, . . . , and 110-*m* of the RF transceiver 108. In one implementation, the wireless communications device is compliant with at least one of IEEE 802.11, 802.11a, 802.11g, 802.11n, and/or 802.16, which are hereby incorporated by reference in their entirety, although other existing and future wireless standards may be used.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A voltage regulator, comprising:
   a master regulator circuit that receives a reference signal, that generates a master bias signal and that includes a transistor having a first gain;
   a first slave regulator circuit that includes a first transistor having a second gain, a control terminal that receives said master bias signal from said master regulator circuit, a first terminal and a second terminal that outputs a first regulated output signal to be received by a first radio frequency (RF) subcircuit; and
   a second slave regulator circuit that includes a second transistor having a third gain, a control terminal that receives said master bias signal from said master regulator circuit, a first terminal, and a second terminal that outputs a second regulated output signal to be received by a second RF subcircuit.

2. The voltage regulator of claim 1 wherein said second and third gains are substantially equal to unity gain.

3. The voltage regulator of claim 1 wherein said master regulator circuit includes an opamp having a non-inverting input that receives said reference signal, an inverting input and an output.

4. The voltage regulator of claim 3 wherein said output of said opamp generates said master bias signal, which is output to a control terminal of said transistor.

5. The voltage regulator of claim 1 wherein said transistor includes a first terminal and wherein said first terminals of said transistor, said first transistor and said second transistor are biased by a first voltage potential.

6. The voltage regulator of claim 1 wherein said transistor, said first transistor and said second transistor are NMOS transistors.

7. The voltage regulator of claim 6 wherein said first gain is greater than unity gain.

8. A Radio Frequency (RF) circuit comprising said voltage regulator of claim 1 and further comprising:
   said first RF subcircuit that receives said first regulated output signal; and
   said second RF subcircuit that receives said second regulated output signal.

9. The RF circuit of claim 8 wherein said RF circuit forms part of a wireless communications device that is compliant with at least one of IEEE 802.11, 802.11a, 802.11g, 802.11n, and 802.16.

10. A voltage regulator, comprising:
    a master regulator circuit that receives a reference signal, that generates a master bias signal and that includes a transistor having a first gain, said master regulator circuit includes an opamp having a non-inverting input that receives said reference signal, an inverting input and an output, wherein said master regulator circuit includes a current source and wherein a second terminal of said transistor communicates with said current source and said inverting input of said opamp;
a first slave regulator circuit that includes a first transistor having a second gain, a control terminal that receives said master bias signal from said master regulator circuit, a first terminal and a second terminal that outputs a first regulated output signal; and
a second slave regulator circuit that includes a second transistor having a third gain, a control terminal that receives said master bias signal from said master regulator circuit, a first terminal, and a second terminal that outputs a second regulated output signal.

11. A voltage regulator, comprising:
a master regulator circuit that includes:
  an opamp having an inverting input, a non-inverting input that receives a reference signal and an output that generates a master bias signal; and
  a transistor having a first gain, a control terminal that receives said master bias signal from said output of said opamp, a first terminal and a second terminal that outputs a feedback signal to said inverting input;
a first slave regulator circuit that includes a first transistor having a second gain that is substantially equal to unity gain, a control terminal that receives said master bias signal from said opamp, a first terminal and a second terminal that outputs a first regulated output signal; and
a second slave regulator circuit that includes a second transistor having a third gain that is substantially equal to unity gain, a control terminal that receives said master bias signal from said opamp, a first terminal, and a second terminal that outputs a second regulated output signal.

12. The voltage regulator of claim 11 wherein said master regulator circuit includes a current source that communicates with said second terminal of said transistor.

13. The voltage regulator of claim 11 wherein said first terminals of said transistor, said first transistor and said second transistor are biased by a first voltage potential.

14. The voltage regulator of claim 11 wherein said transistor, said first transistor and said second transistor are NMOS transistors and wherein said second terminals are sources of said NMOS transistors.

15. The voltage regulator of claim 11 wherein said first gain is greater than unity gain.

16. A Radio Frequency (RF) circuit comprising said voltage regulator of claim 11 and further comprising:
a first RF subcircuit that receives said first regulated output signal; and
a second RF subcircuit that receives said second regulated output signal.

17. A wireless communications device comprising the RF circuit of claim 16 wherein said wireless communications device is compliant with at least one of IEEE 802.11, 802.11a, 802.11g, 802.11n, and/or 802.16.

18. A Radio Frequency (RF) circuit, comprising:
a voltage regulator that includes:
  a master regulator circuit that receives a reference signal, that generates a master bias signal and that includes a transistor having a first gain that is greater than unity gain;
  a first slave regulator circuit that includes a first transistor having a second gain that is substantially equal to unity gain, a control terminal that receives said master bias signal from said master regulator circuit, a first terminal and a second terminal that outputs a first regulated output signal;
  a second slave regulator circuit that includes a second transistor having a third gain that is substantially equal to unity gain, a control terminal that receives said master bias signal from said master regulator circuit, a first terminal, and a second terminal that outputs a second regulated output signal;
a first RF subcircuit that receives said first regulated output signal; and
a second RF subcircuit that receives said second regulated output signal.

19. The RF circuit of claim 18 wherein said master regulator circuit includes an opamp having a non-inverting input that receives said reference signal, an inverting input and an output.

20. The RF circuit of claim 19 wherein said output of said opamp generates said master bias signal, which is output to a control terminal of said transistor.

21. The RF circuit of claim 19 wherein said master regulator circuit includes a current source and wherein a second terminal of said transistor communicates with said current source and said inverting input of said opamp.

22. The RF circuit of claim 18 wherein said transistor includes a first terminal and wherein said first terminals of said transistor, said first transistor and said second transistor are biased by a first voltage potential.

23. The RF circuit of claim 18 wherein said transistor, said first transistor and said second transistor are NMOS transistors and wherein said second terminals are sources of said NMOS transistors.

24. The RF circuit of claim 18 wherein said first gain is greater than unity gain.

25. A wireless communications device comprising the RF circuit of claim 18 wherein said wireless communications device is compliant with at least one of IEEE 802.11, 802.11a, 802.11g, 802.11n, and/or 802.16.

26. A method for operating a voltage regulator, comprising:
receiving a reference signal;
generating a feedback signal using a master transistor having a first gain;
generating a master bias signal based on said reference signal and said feedback signal;
outputting said master bias signal to said master transistor and a plurality of slave transistors having a second gain;
generating a plurality of regulated output signals using said plurality of slave transistors for use in a first radio frequency (RF) subcircuit and a second RF subcircuit.

27. The method of claim 26 wherein said second gain is substantially equal to unity gain.

28. The method of claim 26 wherein said first gain is greater than unity gain.

29. The method of claim 26 further comprising:
supplying a first regulated output signal to said first RF subcircuit using a first slave transistor; and
supplying a second regulated output signal to said second RF subcircuit using a second slave transistor.

30. The method of claim 29 wherein said RF subcircuits form part of a wireless communications device that is compliant with at least one of IEEE 802.11, 802.11a, 802.11g, 802.11n, and/or 802.16.

31. A method for operating a voltage regulator, comprising:
receiving a reference signal at a first op-amp;
generating a feedback signal using a master transistor having a first gain;
receiving said feedback signal at said first op-amp;

generating a master bias signal based on said reference signal and said feedback signal;

outputting said master bias signal to said master transistor and to a plurality of slave transistors having a second gain that is substantially equal to unity gain; and generating a plurality of regulated output signals using said plurality of slave transistors for use in a first radio frequency (RF) subcircuit and a second RF subcircuit.

32. The method of claim 31 further comprising generating a plurality of regulated output signals using said plurality of slave transistors.

33. The method of claim 31 wherein said first gain is greater than unity gain.

34. The method of claim 31 further comprising:

supplying a first regulated output signal to said first RF subcircuit using a first slave transistor; and supplying a second regulated output signal to said second RF subcircuit using a second slave transistor.

35. The method of claim 34 wherein said RF subcircuits form part of a wireless communications device that is compliant with at least one of IEEE 802.11, 802.11a, 802.11g, 802.11n, and/or 802.16.

36. A voltage regulator, comprising:

master regulating means for receiving a reference signal and generating a master bias signal and that includes a transistor having a first gain;

first slave regulating means for outputting a first regulated output signal for use in a first radio frequency (RF) circuit means and that includes a first transistor having a second gain, a control terminal that receives said master bias signal from said master regulating means, a first terminal and a second terminal; and second slave regulating means for outputting a second regulated output signal for use in a first radio frequency (RF) circuit means and that includes a second transistor having a third gain, a control terminal that receives said master bias signal from said master regulator means, a first terminal, and a second terminal.

37. The voltage regulator of claim 36 wherein said second and third gains are substantially equal to unity gain.

38. The voltage regulator of claim 36 wherein said master regulator means includes opamp means for generating said master bias signal based on said reference signal and a feedback signal generated by said transistor.

39. The voltage regulator of claim 38 wherein said opamp means generates said master bias signal, which is output to a control terminal of said transistor.

40. The voltage regulator of claim 36 wherein said transistor includes a first terminal and wherein said first terminals of said transistor, said first transistor and said second transistor are biased by a first voltage potential.

41. The voltage regulator of claim 36 wherein said transistor, said first transistor and said second transistor are NMOS transistors.

42. The voltage regulator of claim 41 wherein said first gain is greater than unity gain.

43. A Radio Frequency (RF) circuit comprising said voltage regulator of claim 36 and further comprising:

said first RF circuit means for receiving said first regulated output signal; and said second RF circuit means for receiving said second regulated output signal.

44. The RF circuit of claim 43 wherein said RF circuit forms part of a wireless communications device that is compliant with at least one of IEEE 802.11, 802.11a, 802.11g, 802.11n, and/or 802.16.

45. A voltage regulator, comprising:

master regulator means for receiving a reference signal and generating a master bias signal and that includes a transistor having a first gain, said master regulator means includes opamp means for generating said master bias signal based on said reference signal and a feedback signal generated by said transistor, wherein said master regulator means includes current means for providing current and wherein a second terminal of said transistor communicates with said current means and said opamp means;

first slave regulating means for outputting a first regulated output signal and that includes a first transistor having a second gain, a control terminal that receives said master bias signal from said master regulator means, a first terminal and a second terminal; and second slave regulating means for outputting a second regulated output signal and that includes a second transistor having a third gain, a control terminal that receives said master bias signal from said master regulator means, a first terminal, and a second terminal.

46. A voltage regulator, comprising:

master regulator means for generating a master bias signal and including:

opamp means for receiving a reference signal and for generating said master bias signal; and a transistor that has a first gain, that receives said master bias signal and that outputs a feedback signal to said opamp means;

first slave regulator means for outputting a first regulated output signal and that includes a first transistor having a second gain that is substantially equal to unity gain, a control terminal that receives said master bias signal from said opamp means, a first terminal and a second terminal; and second slave regulator means for outputting a second regulated output signal and that includes a second transistor having a third gain that is substantially equal to unity gain, a control terminal that receives said master bias signal from said opamp means, a first terminal, and a second terminal.

47. The voltage regulator of claim 46 wherein said master regulator means includes current means for providing current and for communicating with said transistor.

48. The voltage regulator of claim 46 wherein said first terminals of said transistor, said first transistor and said second transistor are biased by a first voltage potential.

49. The voltage regulator of claim 46 wherein said transistor, said first transistor and said second transistor are NMOS transistors and wherein said second terminals are sources of said NMOS transistors.

50. The voltage regulator of claim 46 wherein said first gain is greater than unity gain.

51. A Radio Frequency (RF) circuit comprising said voltage regulator of claim 46 and further comprising:

first RF circuit means for receiving said first regulated output signal; and second RF circuit means for receiving said second regulated output signal.

52. The RF circuit of claim 51 wherein said RF circuit forms part of a wireless communications device that is compliant with at least one of IEEE 802.11, 802.11a, 802.11g, 802.11n, and/or 802.16.

53. A Radio Frequency (RF) circuit, comprising:

voltage regulating means for regulating voltage that includes:

master regulator means for receiving a reference signal and for generating a master bias signal and that includes a transistor having a first gain that is greater than unity gain;

first slave regulator means for outputting a first regulated output signal and that includes a first transistor having a second gain that is substantially equal to unity gain, a control terminal that receives said master bias signal from said master regulator means, a first terminal and a second terminal;

a second slave regulator means for outputting a second regulated output signal and that includes a second transistor having a third gain that is substantially equal to unity gain, a control terminal that receives said master bias signal from said master regulator means, a first terminal, and a second terminal;

first RF circuit means that receives said first regulated output signal; and second RF circuit means that receives said second regulated output signal.

54. The RF circuit of claim 53 wherein said master regulator means includes opamp means for generating said master bias signal based on said reference signal.

55. The RF circuit of claim 54 wherein said opamp means outputs said master bias signal to a control terminal of said transistor.

56. The RF circuit of claim 54 wherein said master regulator means includes current means for providing current and wherein a second terminal of said transistor communicates with said current means and said opamp means.

57. The RF circuit of claim 53 wherein said transistor includes a first terminal and wherein said first terminals of said transistor, said first transistor and said second transistor are biased by a first voltage potential.

58. The RF circuit of claim 53 wherein said transistor, said first transistor and said second transistor are NMOS transistors and wherein said second terminals are sources of said NMOS transistors.

59. The RF circuit of claim 53 wherein said first gain is greater than unity gain.

60. A wireless communications device comprising the RF circuit of claim 53 wherein said wireless communications device is compliant with at least one of IEEE 802.11, 802.11a, 802.11g, 802.11n, and/or 802.16.

* * * * *